(12) United States Patent
Ng et al.

(10) Patent No.: US 9,666,815 B2
(45) Date of Patent: May 30, 2017

(54) SURFACE TREATMENT OF HYDROPHOBIC FERROELECTRIC POLYMERS FOR PRINTING

(75) Inventors: Tse Nga Ng, Palo Alto, CA (US); Ana Claudia Arias, Los Gatos, CA (US); Jurgen H. Daniel, San Francisco, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 1900 days.

(21) Appl. No.: 12/334,370

(22) Filed: Dec. 12, 2008

(65) Prior Publication Data

US 2010/0148232 A1 Jun. 17, 2010

(51) Int. Cl.
- *H01L 51/52* (2006.01)
- *H01L 51/05* (2006.01)
- *H01L 51/00* (2006.01)
- *H05K 3/12* (2006.01)
- *H05K 3/38* (2006.01)
- *H01L 27/12* (2006.01)

(52) U.S. Cl.
CPC ........ *H01L 51/052* (2013.01); *H01L 51/0005* (2013.01); *H01L 51/0022* (2013.01); *H05K 3/125* (2013.01); *H05K 3/1208* (2013.01); *H01L 27/1292* (2013.01); *H01L 51/0036* (2013.01); *H01L 51/0043* (2013.01); *H01L 51/0545* (2013.01); *H05K 3/381* (2013.01); *H05K 2203/013* (2013.01); *H05K 2203/087* (2013.01); *H05K 2203/095* (2013.01); *H05K 2203/1173* (2013.01)

(58) Field of Classification Search
USPC .......................... 257/295, E27.104, E21.663
See application file for complete search history.

(56) References Cited

U.S. PATENT DOCUMENTS

| | | | |
|---|---|---|---|
| 2006/0113569 A1* | 6/2006 | Akinwande et al. | 257/213 |
| 2007/0243678 A1* | 10/2007 | Newsome et al. | 438/238 |
| 2009/0155964 A1* | 6/2009 | Chang et al. | 438/197 |

OTHER PUBLICATIONS

Kim, Sung-Jin, et al., "Low-Leakage Polymeric Thin-Film Transistors Fabricated by Laser Assisted Lift-Off Technique", Japanese J. of Appl. Phys., vol. 44, No. 35, 2005, p. 1109-1111.

Guo, Dong, et al., "Effect of UV/ozone Treatment of the Dielectric Layer on the Device Performance of Pentacene Thin Film Transistors", Chem. Phys. Letters 429, 2006, p. 124-128.

Ouyang M., et al., "Conversion of Some Siloxane Polymers to Silicon Oxide by UV/Ozone Photochemical Process", Chem. Mater., vol. 12, 2000, p. 1591-1596.

Ng, Tse Nga, et al., "Organic inkjet-patterned memory array based on ferroelectric filed-effect transistors", Organic Electronics 2011, pp. 2012-2018.

Ng, Tse Nga, et al., "Degradation mechanisms of organic ferroelectric field-effect transistors used as nonvolatile memory", J. of Applied Physics, vol. 106, 2009.

* cited by examiner

*Primary Examiner* — Mark Tornow
(74) *Attorney, Agent, or Firm* — Blakely Sokoloff Taylor & Zafman LLP

(57) ABSTRACT

An embodiment is a method and apparatus to treat surface of polymer for printing. Surface of a polymer having a surface energy modified for a time period to control a feature characteristic and/or provide a hysteresis behavior. A material is printed on the surface to form a circuit pattern having at least one of the controlled feature characteristic and the hysteresis behavior.

9 Claims, 6 Drawing Sheets

SURFACE TREATMENT OF HYDROPHOBIC FERROELECTRIC POLYMERS FOR PRINTING

STATEMENT REGARDING FEDERALLY SPONSORED RESEARCH AND DEVELOPMENT

This invention was made with Government support under Contract No. W81XWH-08-C-0065 awarded by the Defense Advanced Research Projects Agency (DARPA). The Government has certain rights in this invention.

TECHNICAL FIELD

The presently disclosed embodiments are directed to the field of electronics, and more specifically, to printing.

BACKGROUND

Printing processes have been used for patterning of lines or patterns in electronic or semiconductor devices. Gravure offset printing was used to make 50-μm-wide conductor lines on ceramic substrates and to pattern thin-film transistors for low-cost displays. Offset printing was used for the fabrication of capacitors and printed and plated metal lines as narrow as 25 μm. Printed circuit boards and integrated circuit packaging are popular applications of screen printing in the electronics industry. Inkjet printing has also become popular in various industrial fabrication processes, from microelectronics soldering, micro-machined parts, to multi-color polymer light-emitting diode displays.

However, currently it is problematic to directly print metal or polymeric conductor ink onto hydrophobic surfaces, because the commercially available conductive inks tend to be hydrophilic and de-wet into separate droplets. Cracking of the conductor lines is prevalent on dielectric polymers such as poly(vinylidene fluoride/trifluoroethylene, or P(VDF-TrFE), and leads to failure of the thin film transistor (TFT) array FIG. 8 illustrates a prior art thin-film transistor (TFT) circuit 800 with two-layer dielectric to avoid the problem of printing directly on hydrophobic P(VDF-TrFE). The TFT 800 includes a substrate 810, a 2-layer dielectric 820, a semiconductor layer 830; and source, drain, and gate electrodes 832, 834, and 836. The 2-layer dielectric 820 includes a ferroelectric PVDF-TrFE layer 822 (800 nm) and another thin layer of dielectric 825 polymer PVP (100 nm) that is hydrophilic and compatible for printing. FIG. 9 illustrates prior art curves for the two-layer dielectric TFT shown in FIG. 8. The curves 910, 920, and 930 show the source-drain current $I_{sd}$ as function of the gate voltage $V_g$. The curves 910, 920, and 930 correspond to different values of the source-drain voltages. The curves 910, 920, and 930 may correspond to values of the source-drain voltages of −5V, −10V, and −40V, respectively. The values of the $I_{sd}$ $I_0$, $I_1$, $I_2$, $I_3$, $I_4$, $I_5$, and $I_6$ may be 0, $-1\times10^{-7}$ A, $-2\times10^{-7}$ A, $-3\times10^{-7}$ A, $-4\times10^{-7}$ A, $-5\times10^{-7}$ A, and $-6\times10^{-7}$ A, respectively. The values of the $V_g$ $V_{-2}$, $V_{-1}$, $V_0$, $V_1$, and $V_2$ may be −50 V, −25 V, 0 V, 25 V, and 50 V, respectively. As the gate voltage varies the source-drain current shows no or little hysteresis behavior. Accordingly, the prior art design does not allow data storage as a non-volatile memory cell.

SUMMARY

One disclosed feature of the embodiments is a method and apparatus to treat surface of polymer for printing. Surface of a polymer having a surface energy modified for a time period to control a feature characteristic and/or provide a hysteresis behavior. A material is printed on the surface to form a circuit pattern having at least one of the controlled feature characteristic and the hysteresis behavior.

One disclosed feature of the embodiments is an apparatus having a polymer with a treated surface for printing. A dielectric layer made of a polymer having a surface with modified surface energy. The modified surface energy controls a feature characteristic and/or provides a hysteresis behavior. A circuit pattern is printed on the surface. The circuit pattern has at least one of the controlled feature characteristic and the hysteresis behavior.

One disclosed feature of the embodiments is system to treat surface of polymer for printing. At least one of an ultra-violet (UV) source and an ozone-generating source that generates ozone is used. A polymer has a surface exposed under the at least one of the UV source and the ozone-generating source for a pre-determined time period. The surface has a surface energy modified to control a feature characteristic and/or provide a hysteresis behavior. An ink jet printer prints a circuit pattern on the surface with the modified surface energy.

BRIEF DESCRIPTION OF THE DRAWINGS

Embodiments may best be understood by referring to the following description and accompanying drawings that are used to illustrate various embodiments. In the drawings.

DETAILED DESCRIPTION

Figure 1:
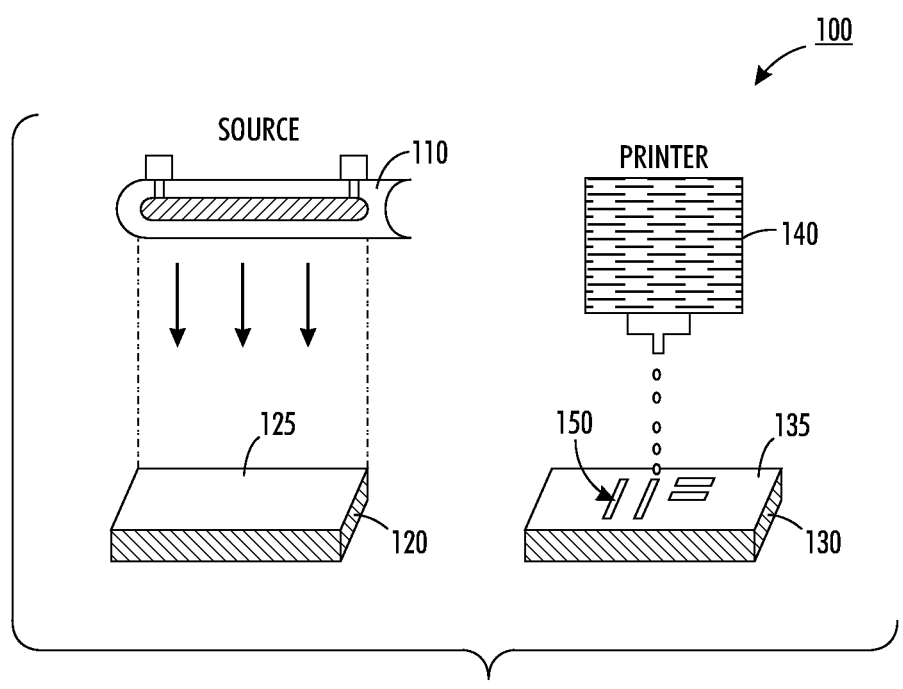
FIG. 1 is a diagram illustrating a system with an ozone-generating source and inkjet printer to perform surface treatment according to one embodiment.

One disclosed feature of the embodiments is a technique to treat surface of polymer for printing. Surface of a polymer having a surface energy modified for a time period to control a feature characteristic and/or provide a hysteresis behavior. A material is printed on the surface to form a circuit pattern having at least one of the controlled feature characteristic and the hysteresis behavior. The feature characteristic may include a feature size, feature uniformity, feature smoothness, line width, or ink contact angle. The hysteresis behavior provides the non-volatile memory functionality of a memory cell. As the surface energy is modified, the contact angle with the ink is adjusted. The contact angle between the ink and polymer surface is here defined to be hydrophilic if it is below 80 degrees. However, the necessary contact angle depends on the ink-polymer combination and may be adjusted for the printing needs.

One disclosed feature of the embodiments is an apparatus having a polymer with a treated surface for printing. A dielectric layer made of a polymer having a surface with modified surface energy. The modified surface energy controls a feature characteristic and/or provides a hysteresis behavior. A circuit pattern is printed on the surface. The circuit pattern has at least one of the controlled feature characteristic and the hysteresis behavior. The modified surface energy provides an appropriate ink contact angle for printing.

One disclosed feature of the embodiments is system to treat surface of polymer for printing. At least an ultra-violet (UV) source and an ozone-generating source that generates ozone is used. A polymer has a surface exposed under at least one of the UV source and the ozone-generating source for a pre-determined time period. The surface has a surface energy modified to control a feature characteristic and/or provide a hysteresis behavior. An ink jet printer prints a circuit pattern on the surface with the modified surface energy.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a method and apparatus to prevent cracking of conductor lines on dielectric polymers which may lead to failure of TFT arrays. The technique enables patterning of TFTs on ferroelectric polymers by changing the surface energy of the polymer surface. The surface energy is related to the hydrophobicity of the polymer surface. This may be performed by UV and/or ozone treatment of the polymer surface followed by printing continuous conductor lines or capacitor electrodes. The modified or treated polymer retains the electronic functionality. The UV and/or ozone treatment may be performed by using UV source or oxygen plasma. The UV treatment may be a better treatment than the alternative use of oxygen plasma which may be too harsh for polymer dielectrics.

In one embodiment, the polymer is placed, or exposed, under at least one of an UV source and an ozone-generating source such as a UV lamp that generates ozone. The polymer surface energy is modified, causing the polymer surface to become more hydrophilic, or less hydrophibic, and shows lower contact angle with the conductive ink. The UV and/or ozone treatment is suitable for inkjet printing. The printed lines and electrodes remain continuous after the ozone treatment and are less likely to form, cracks due to de-wetting of printed ink during the annealing process. When printing on a ferroelectric co-polymer, or a Poly (Vinylidene Fluoride) (PVDF) co-polymer, such as the P(VDF-TrFE), the transistor and capacitor structure show that the ferroelectric properties are retained and not affected by this surface modification. Compared to untreated devices, the printed transistors with UV and/or ozone surface treatment show larger on-off ratio in the hysteresis behavior for use as data storage devices.

FIG. 1 is a diagram illustrating a system 100 with at least one of a UV source and an ozone-generating source and inkjet printer to perform surface treatment according to one embodiment. The system 100 includes a source 110, a polymer 120, a treated polymer 130, and a printer 140. The system 100 may include more or less than the above components.

The source 110 may be an UV source or an ozone-generating source that generates ozone ($O_3$). The source 110 may be a UV lamp or oxygen plasma source. Ozone is generated from the UV wavelength emitted deep in the spectrum, particularly less than 210 nm in arc lamp systems. Typical UV lamps may include pulsed Xenon, Excimer, microwave excited, or Hg arc lamps.

The polymer 120 may be any suitable polymer for fabrication of electronic components such as TFTs. It may be a hydrophobic polymer or a ferroelectric material. It may be used as dielectrics in circuit layers. In one embodiment, the polymer 130 has a hydrophobic surface such as a PVDF co-polymer (e.g., P(VDF-TrFE)). The polymer 120 has a surface 125 that is exposed under the source 110 for a pre-determined time period. As the chain length of the polymer molecules on the surface is shortened under the influence of the generated ozone, the surface energy of the surface 125 is modified, causing the surface 125 to become more hydrophilic, or less hydrophobic. The hydrophobicity of the surface 125 may be reduced by increasing the level of UV and/or ozone exposure. This may be achieved by using a high power UV lamp or by increasing the exposure time period.

After the surface 125 is treated with UV and/or ozone to achieve a desired modified surface energy or reduced hydrophobicity, the polymer 120 becomes the treated polymer 130. The treated polymer 130 has a surface 135 having a surface energy modified, or a hydrophobicity reduced, at a desired level to control the feature characteristic of the printing pattern and/or to provide hysteresis behavior to the printed circuit pattern. The feature characteristic may include the smoothness or uniformity of the feature or the line width. For example, after modifying the surface energy, a narrow continuous line of silver nanoparticle ink may be jet-printed without problems of excessive ink spreading, de-wetting or formation of bulges in the printed line. A more uniform line with line width and line thickness uniformity results.

The printer 140 prints a circuit pattern 150 on the oxidized surface 135 of the polymer 130. In one embodiment, the printer 140 is an inkjet printer. The inkjet printer 140 may operate in a continuous or drop-on-demand (DOD) mode. The inkjet printing may be combined with spin coating to fabricate the TFTs.

The circuit pattern 150 may be an electronic conducting feature, a metal, a conductor or a semiconductor such as metal nanoparticles, a polymeric ink pattern, a circuit including at least an active element or a passive element, a non-volatile memory cell, a conductive trace, a capacitor electrode, a bus line, a via hole interconnect, and a contact, or any other patterns that are suitable for fabrication of electronic devices. Examples of an active element may include a diode or a TFT. Examples of a passive element may include a resistor, a capacitor, or an inductor. Since the surface 135 is treated to be modified with UV and/or ozone, the surface becomes more hydrophilic which facilitates the printing of the circuit pattern 150. The printed conductive trace has a uniform width and low resistance.

The treated polymer 130 allows the circuit pattern 150 to be printed on the treated surface 135 without cracking as result of de-wetting. Without the surface treatment, severe de-wetting may destroy the capacitor electrode or crack conductive line. In one experiment, lines using Ag conductive ink are printed on an untreated surface. A 1 mm×50 μm printed conductive line becomes cracked leading to a resistance of 4 kΩ. In contrast, for the same printing dimensions with a treated surface, the capacitor electrodes and lines printed on UV- and/or ozone-treated polymer are uniform and the resistance of a 1 mm×50 μm line is measured to be 14%. Furthermore, the line width of the conducting line may be adjusted by varying the exposure time.

The surface treatment of the polymer 120 retains all the functional aspects of the material. For example, the bulk hysteresis behavior of a printed capacitor using ferroelectric dielectric PVDF co-polymer, such as P(VDF-TrFE), is maintained. The hysteresis behavior is useful in printing non-volatile memory devices. The surface treatment is useful to fabricate a memory cell by printing.

Figure 8:
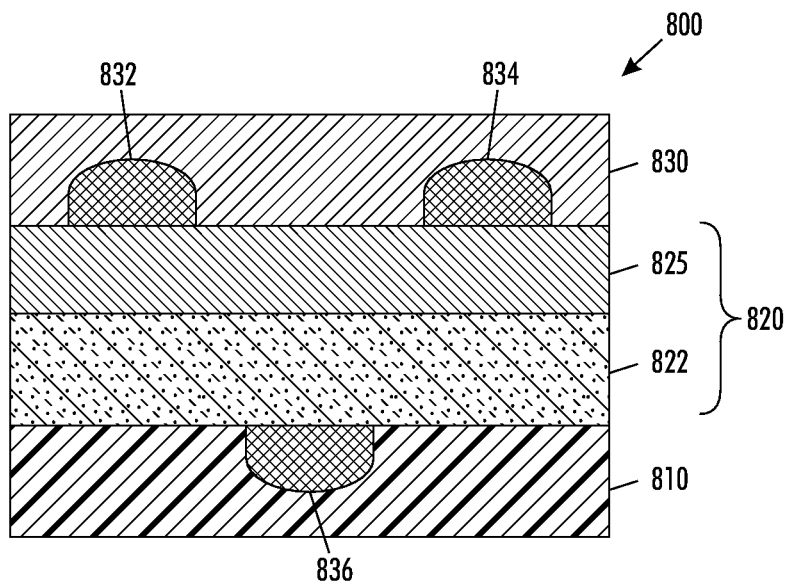
FIG. 8 is a diagram illustrating a prior art TFT circuit.
Figure 9:
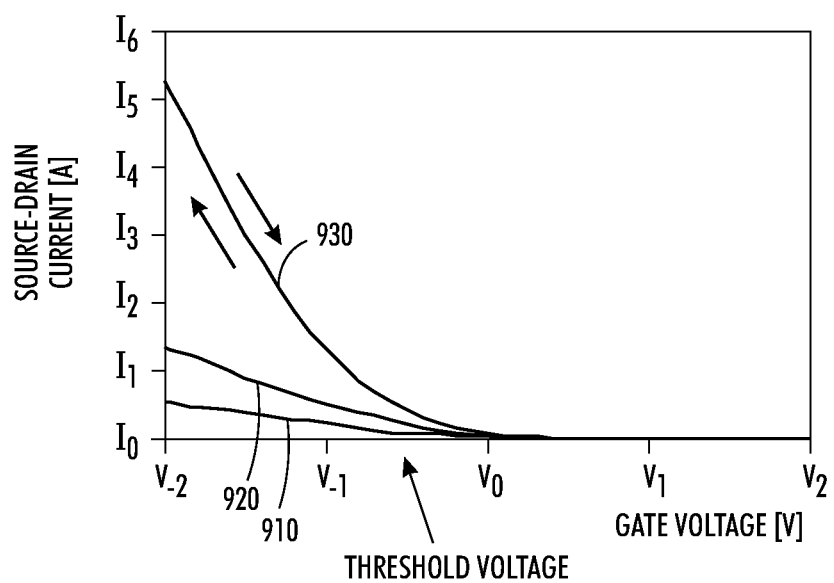
FIG. 9 is a diagram illustrating curves of the prior art TFT circuit.

To avoid the problem of direct printing on a hydrophobic polymer (e.g., P(VDF-TrFE)), a bi-layer construction that uses a two-layer dielectric which includes a ferroelectric P(VDF-TrFE) and a thin dielectric polymer PVP may be employed as shown in the prior art circuit in FIG. 8. However, this fabrication technique does not retain the hysteresis needed for data storage as shown in FIG. 9. In contrast, a single layer of dielectric using polymer with surface treatment exhibits high gate capacitance and hysteresis behavior for use as a non-volatile memory device.

Figure 2:
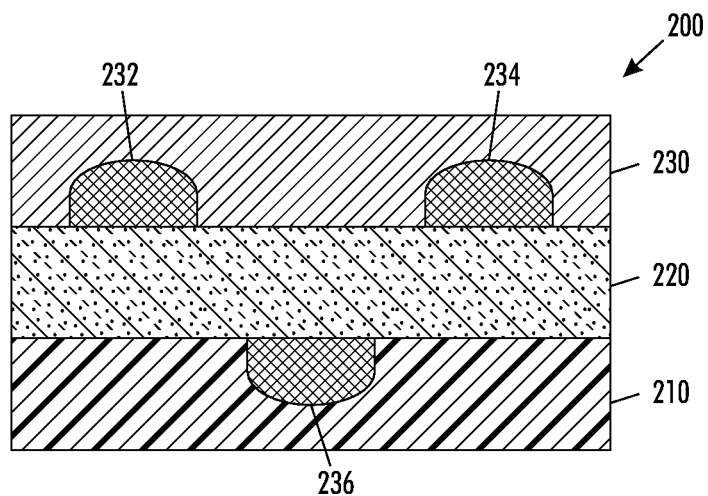
FIG. 2 is a diagram illustrating a thin film transistor according to one embodiment.

FIG. 2 is a diagram illustrating a thin film transistor (TFT) 200 according to one embodiment. The TFT 200 includes a substrate 210, a dielectric layer 220, a semiconductor layer 230; and source, drain, and gate electrodes 232, 234, and 236. The TFT 200 may include more or less than the above components. The TFT 200 uses only a single layer of dielectric, the dielectric layer 220. The TFT 200 may be used as a non-volatile memory cell. The non-volatile memory cells may form a memory array.

The substrate 210 may be a substrate made of any suitable material, including silicon wafer, glass plate, plastic film or sheet. Examples of the substrate material may be acrylics, epoxies, polyamides, polycarbonates, polyimides, or polyketones.

The dielectric layer 220 may be any suitable dielectric. In one embodiment, the dielectric is a hydrophobic polymer such as poly-silsesquioxane (PSSQ). In another embodiment, it is a ferroelectric polymer, such as PVDF and its co-polymer P(VDF-TrFE). The surface of the dielectric layer is UV and/or ozone treated to exhibit a desired surface energy which may provide a desired contact angle with the printing ink.

The semiconductor layer 230 may be any suitable semiconductor. In one embodiment, it is a solution-based polymeric semiconductor. In one embodiment, the polymeric semiconductor may be regioregular polythiophene, poly(5, 5'-bis-dodecyl-2-thienyl)-2,2'-bithiophene (PQT-12) or poly (9-9'dioctyl-fluorene-co-bithiophene) (F8T2). The semiconductor layer 230 may be deposited using an additive jet-printing process.

The source, drain, and gate electrodes 232, 234, and 236 may be any suitable electrically conductive material. It may be made of thin metal, aluminum, gold, chromium, indium tin oxide, conducting polymer such as PSS-PEDOT. They may be deposited using a printing process.

In contrast to the bi-layer construction that uses a two-layer dielectric to avoid the problem of direct printing on hydrophobic polymer (e.g., P(VDF-TrFE)), the TFT 200 exhibits hysteresis behavior to allow data storage such as non-volatile memory. The TFT 200 may have slightly higher switching voltages than the untreated TFT, but the on-off ratio is larger than the untreated TFT.

Figure 3:
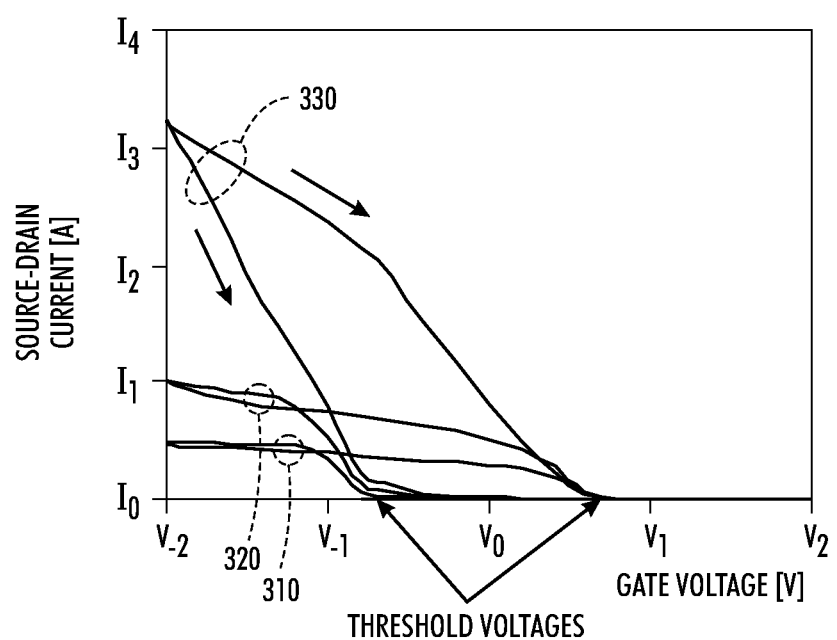
FIG. 3 is a diagram illustrating curves showing hysteresis behavior according to one embodiment

FIG. 3 is a diagram illustrating curves showing hysteresis behavior according to one embodiment. The curves include a curve 310, a curve 320, and a curve 330. The curves 310, 320, and 330 show the source-drain current $I_{sd}$ as function of the gate voltage $V_g$. The curves 310, 320, and 330 correspond to different values of the source-drain voltages. In one experiment, the curves 310, 320, and 330 correspond to values of the source-drain voltages of −5V, −10V, and −40V, respectively. The values of the $I_{sd}$ $I_0$, $I_1$, $I_2$, $I_3$, and $I_4$ are 0, $-4 \times 10^{-7}$ A, $-8 \times 10^{-7}$ A, $-1.2 \times 10^{-6}$ A, and $-1.6 \times 10^{-6}$ A, respectively. The values of the $V_g$ $V_{-2}$, $V_{-1}$, $V_0$, $V_1$, and $V_2$ are −50 V, −25 V, 0 V, 25 V, and 50 V, respectively. It is noted that these values may be changed according to the experimental conditions.

Each of the curves 310, 320, and 330 shows that as the gate voltage increases, turning on the transistor, and then decreases, turning off the transistor, the source-drain current exhibits a hysteresis behavior. This hysteresis behavior provides the transistor a memory functionality which is used as data storage for a non-volatile memory cell. Accordingly, modifying the surface energy of the surface of the polymer may provide a hysteresis behavior to the circuit printed on the polymer surface.

Compared to an untreated device, such as the prior art circuit shown in FIG. 8, the TFT with treated dielectric surface shows higher switching voltages (higher by ~5V) than the untreated TFT in FIG. 8. However, the on-off ratio is larger for the treated TFT. Varying the treatment time from 25 s seconds to 150 seconds does not significantly alter the switching voltages.

An advantage of using UV- and/or ozone-treated polymer is that the line width of the conductive lines printed on the treated surface may be controlled. This lowers conductor resistance by dry surface treatment that is compatible with roll-to-roll processing at low temperature.

Figure 4:
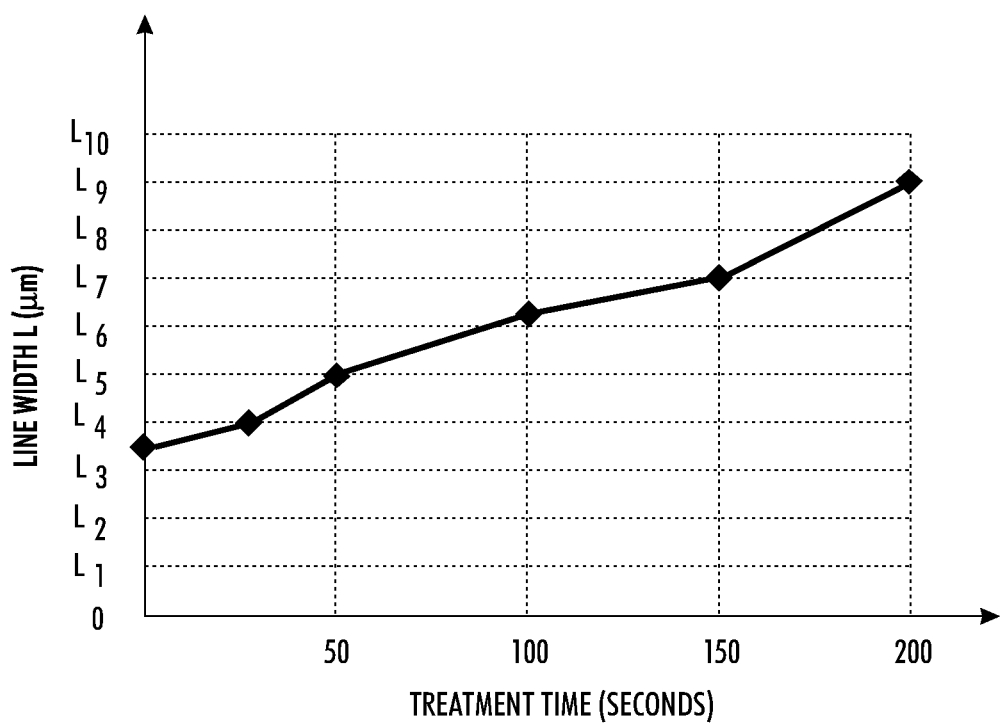
FIG. 4 is a diagram illustrating line width of lines as function of treatment time according to one embodiment.

FIG. 4 is a diagram illustrating line width L of lines as function of treatment time according to one embodiment. The diagram shows the line width L in μm from values ranging from L1 to L10 and the treatment time in seconds. The treatment time is the time the surface of the polymer is exposed under at least one of the UV source and the ozone-generating source.

The treatment time may range from a few seconds to 200 seconds. The line width increases as the treatment time increases. In one experiment, the values of $L_1$, $L_2$, $L_3$, $L_4$, $L_5$, $L_6$, $L_7$, $L_8$, $L_9$, $L_{10}$ are 10 μm, 20 μm, 30 μm, 40 μm, 50 μm, 60 μm, 70 μm, 80 μm, 90 μm, and 100 μm, respectively. The relationship is somewhat linear.

Accordingly, the line width may be controlled by varying the exposure time. For narrow line widths, the exposure time is short. For large lines widths, the exposure time is long. It is contemplated that the surface energy, or the hydrophobicity, of the surface of the polymer may also be a function of the time period of exposure the surface under the UV and/or ozone source. Accordingly, modifying the surface energy of the surface of the polymer may control a feature characteristic (e.g., feature uniformity, feature size, line width, ink contact angle) of the circuit pattern.

Figure 5:
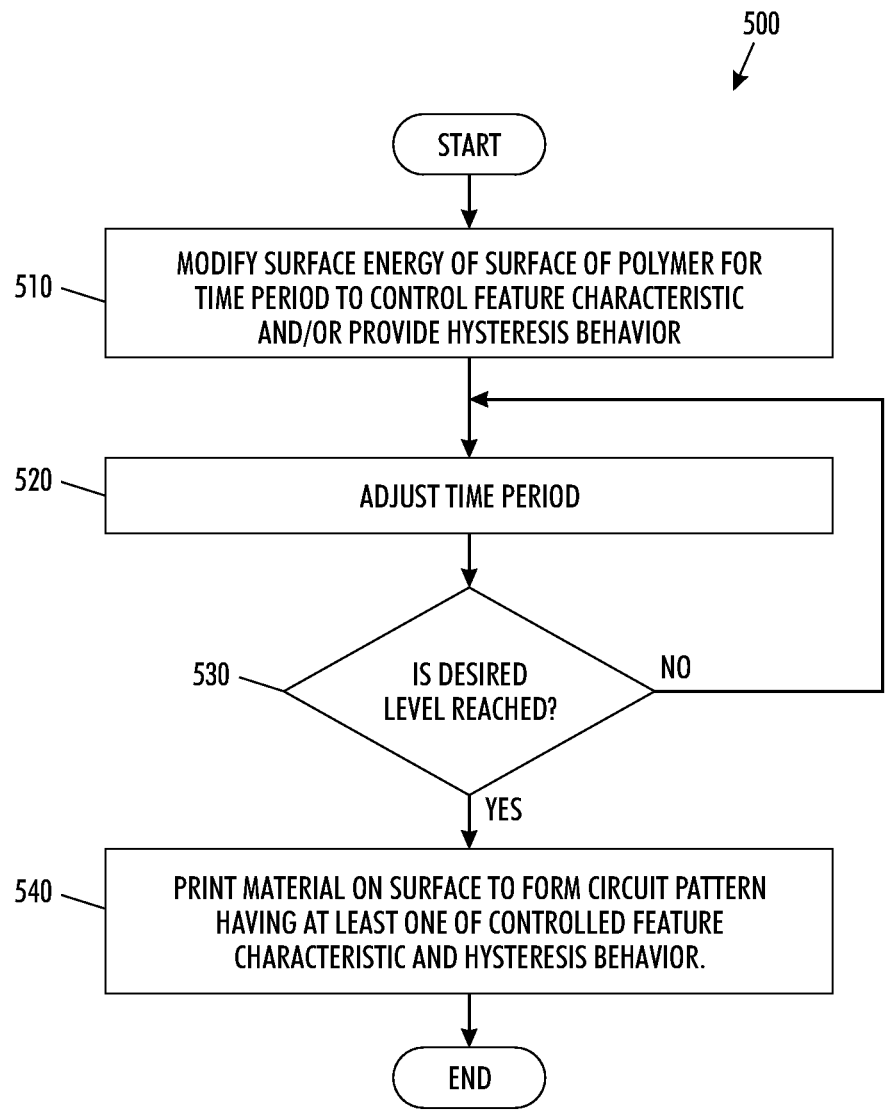
FIG. 5 is a flowchart illustrating a process to treat surface of polymer for printing according to one embodiment.

FIG. 5 is a flowchart illustrating a process 500 to treat surface of polymer for printing according to one embodiment.

Upon START, the process 500 modifies surface energy of surface of a polymer for a time period to control a feature characteristic and/or to provide hysteresis behavior (Block 510). The feature characteristic may include a feature size, feature uniformity, feature smoothness, line width, or ink contact angle. This may also reduce the hydrophobicity. Reducing the hydrophobicity is increasing the hydrophilicity. In one embodiment, the polymer is a hydrophobic polymer or a ferroelectric material. In one embodiment, the ferroelectric material is a PVDF copolymer, such as P(VDF-TrFE). Next, the process 500 adjusts the time period (Block 520). Then, the process 500 determines if the surface energy or the hydrophobicity reaches a desired level (Block 530). The desired level may be obtained from experiments for desired result. For example, if the line width is desired to be at a certain value, experimental curves such as the curve shown in FIG. 4 may be used to guide the selection of the time period. If the desired level is not reached, the process 500 returns to Block 520 to adjust the time period. Otherwise, the process 500 prints a material on the surface to form a circuit pattern (Block 540). The circuit pattern may be an electronic conducting feature, a metal, a conductor or a semiconductor such as metal nanoparticles, a polymeric ink pattern, a circuit including at least an active element or a passive element, a non-volatile memory cell, a conductive trace, a capacitor electrode, a bus line, a via hole interconnect, a contact, or any other patterns that are suitable for fabrication of electronic devices. The process 500 is then terminated.

Figure 6:
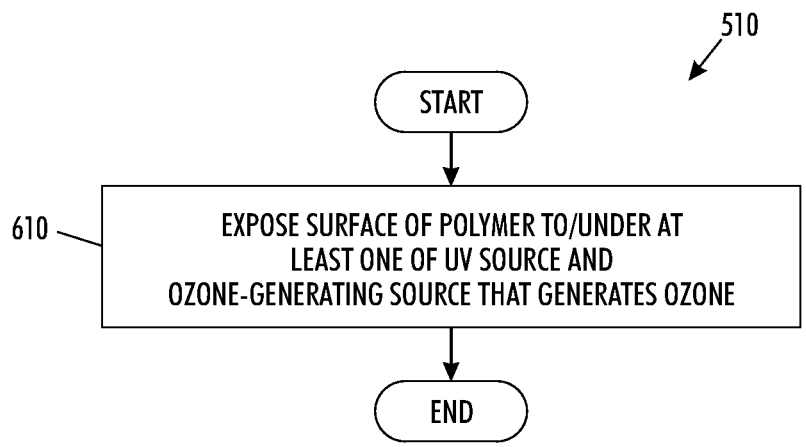
FIG. 6 is a flowchart illustrating a process to modify surface energy of surface of polymer according to one embodiment.

FIG. 6 is a flowchart illustrating the process 510 shown in FIG. 5 to modify the surface energy of the surface of polymer according to one embodiment.

Upon START, the process 510 exposes the surface of the polymer to/under at least one of a UV source and an ozone-generating source that generates ozone (Block 610). The process 510 is then terminated.

Figure 7:
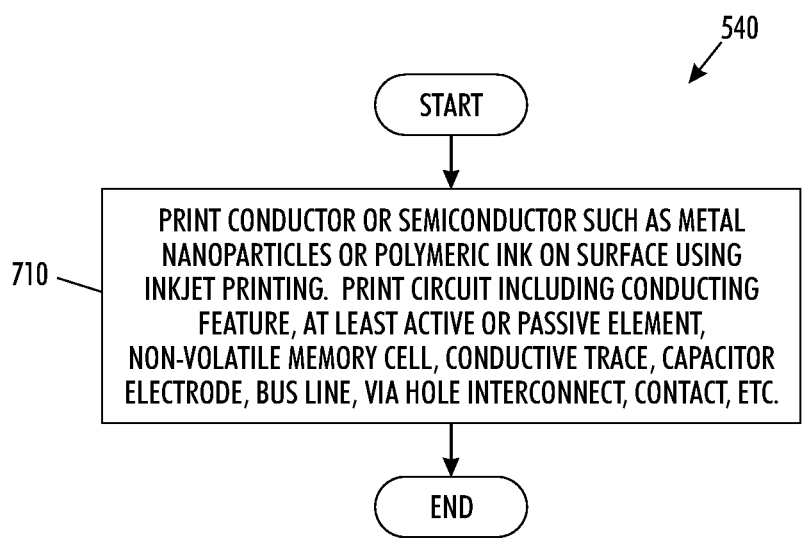
FIG. 7 is a flowchart illustrating a process to print material on polymer surface according to one embodiment.

FIG. 7 is a flowchart illustrating the process 540 shown in FIG. 5 to print material on polymer surface according to one embodiment.

Upon START, the process 540 prints a conductor or a semiconductor such as metal nanoparticles, or a polymeric ink on the surface to form the circuit pattern (Block 710). The circuit pattern may correspond to a conducting feature, a circuit including at least an active element or a passive element, a non-volatile memory cell, a conductive trace, a capacitor electrode, a bus line, a via hole interconnect, or a contact, etc. The process 540 is then terminated.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus comprising:
    a dielectric layer made of a polymer having a surface with modified surface energy, the modified surface energy controlling a feature characteristic and/or providing a hysteresis behavior, the dielectric layer including a surface and a portion below the surface, the surface of the dielectric layer being made of the surface with the modified surface energy of the polymer and the portion below the surface of the dielectric layer being made of the polymer, the surface of the dielectric layer being either (i) more hydrophobic or (ii) less hydrophobic than the portion below the surface of the dielectric layer; and
    a circuit pattern printed on the surface, the circuit pattern having at least one of the controlled feature characteristic and the hysteresis behavior.

2. The apparatus of claim 1 wherein the feature characteristic includes at least one of a feature size, a feature uniformity, a contact angle, and a line width.

3. The apparatus of claim 1 wherein the polymer is a hydrophobic polymer or a ferroelectric material.

4. The apparatus of claim 3 wherein the ferroelectric material is a Poly (Vinylidene Fluoride) (PVDF) co-polymer.

5. The apparatus of claim 1 wherein the circuit pattern comprises:
    a conductor or a semiconductor, including metal nanoparticles, or a polymeric ink pattern.

6. The apparatus of claim 1 wherein the circuit pattern comprises:
    a circuit including at least one of an active element and a passive element.

7. The apparatus of claim 6 wherein the circuit comprises:
    a non-volatile memory cell.

8. The apparatus of claim 1 wherein the circuit pattern comprises one of:
    a conductive trace, a capacitor electrode, a via hole interconnect, and a contact.

9. The apparatus of claim 8, wherein the conductive trace has a uniform width and low resistance.

* * * * *